United States Patent [19]
Wen

[11] Patent Number: 5,716,886
[45] Date of Patent: Feb. 10, 1998

[54] METHOD OF FABRICATING A HIGH VOLTAGE METAL-OXIDE SEMICONDUCTOR (MOS) DEVICE

[75] Inventor: Jemmy Wen, Hsinchu, Taiwan

[73] Assignee: United Microelectronics Corporation, Taiwan

[21] Appl. No.: 751,718

[22] Filed: Nov. 18, 1996

[30] Foreign Application Priority Data

Sep. 21, 1996 [TW] Taiwan ................... 85111564

[51] Int. Cl.[6] .................. H01L 21/336; H01L 21/76
[52] U.S. Cl. .................. 438/299; 438/294; 438/298; 438/430
[58] Field of Search ................. 437/40 R, 41 R, 437/44, 913, 69, 29, 203, 40 RG, 41 RG

[56] References Cited

U.S. PATENT DOCUMENTS

| | | | |
|---|---|---|---|
| 5,192,696 | 3/1993 | Bulat et al. | 437/29 |
| 5,474,940 | 12/1995 | Tsukamoto | 437/44 |
| 5,510,288 | 4/1996 | Hong | 437/45 |
| 5,518,938 | 5/1996 | Yang | 437/44 |
| 5,547,895 | 8/1996 | Yang | 437/69 |
| 5,612,242 | 3/1997 | Hsu | 437/67 |

*Primary Examiner*—Michael Trinh
*Attorney, Agent, or Firm*—Rabin, Champagne, & Lynt, P.C.

[57] ABSTRACT

A high-voltage MOS (metal-oxide semiconductor) device and a method for fabricating the same is provided. The high-voltage MOS device features the forming of trench-type source/drain regions by the use of silicon nitride layers to conduct a self-alignment etching process on a polysilicon conductive layer. In addition, an insulating layer is formed between the source/drain regions and the substrate, which prevents the breakdown at the junction between the source/drain regions and the substrate and also prevent the occurrence of leakage current therein. The forming of metal contact windows on the source/drain regions over isolation layers also allows the prevention of over etching, the occurrence of metal spikes, and misalignment of critical dimensions on the substrate. The thus fabricated high-voltage MOS device is therefore more reliable.

11 Claims, 5 Drawing Sheets

5,716,886

METHOD OF FABRICATING A HIGH VOLTAGE METAL-OXIDE SEMICONDUCTOR (MOS) DEVICE

BACKGROUND OF THE INVENTION

1. Field of the Invention

This invention relates to semiconductors, and more particularly, to a high-voltage MOS (metal-oxide semiconductor) device and a method for fabricating the same. This High-voltage MOS device features the ability to prevent the junction breakdown between source/drain regions and substrate and also the occurrence of leakage current therein.

2. Description of Related Art

Conventional MOS deuces are generally provided with isolation layers and underlying drift regions so as to separate the source/drain regions from the gates such that the MOS devices can be operable under high-voltage conditions. The semiconductor structure of such a MOS device is described in more detail in the following with reference to FIGS. 1A through 1D.

Referring first to FIG. 1A, a substrate 110 such as a P-type silicon substrate is subjected to thermal oxidation so as to form a pad oxide 111 on the top suite thereof. Thereafter, a silicon nitride 112 is formed over the pad oxide 111 by chemical-vapor deposition (CVD). A photolithographic and etching process is then conducted on the wafer for pattern definition and removal of selected potions oft he silicon nitride 112 so as to form openings 113 in the silicon nitride 112. The exposed surfaces of the pad oxide 111 are intended for the forming of drift regions in later steps. Subsequently, an ion implantation process is conducted on the wafer so as to implant an N-type dopant such as phosphor ions through the openings 113 into those regions indicated by the reference numeral 14 in the substrate 110 so as to for lightly-doped regions therein.

Referring next to FIG. 1B, in the subsequent step, the wafer is subjected to thermal oxidation such as wet oxidation so as to form isolation layers 115 in the openings 113. The isolation layers 115 can be oxide layers, for example, that are formed by local oxidation of silicon (LOCOS). Through this process, the implanted phosphor ions are also driven in to form $N^-$-type lightly-doped drift regions 114.

Referring onward to FIG. 1C, in the subsequent step, an etching process such as wet etching is conducted on the wafer so as to remove the silicon nitride 112 and the pad oxide 111 successively. After that, a gate oxide layer 116 is formed on the substrate 110 either by the CVD method or by thermal oxidation. Subsequently, a conductive layer 117, such as a highly-doped polysilicon layer, is formed over the gate oxide layer 116 by the CVD method. A photolithographic and etching process is then conducted on the wafer for pattern definition and removal of selected portions of both the conductive layer 117 and gate oxide layer 116 so as to form a gate 118. Next, the gate 118 and the isolation layers 115 are used together as a mask to conduct an ion implantation process on the wafer so as to implant an N-type dopant such as phosphor ions into the substrate 110. The doped regions are further heated so as to drive in the implanted ions to form $N^-$-type lightly-doped regions 119. Then, the gate 118 and the isolation layers 115 are used together again as a mask to conducted a second ion implantation process on the wafer so as to implant a dopant such as arsenic ions into the substrate 110. The doped regions are further heated so as to drive in the implanted ions to form $N^+$ heavily-doped source/drain regions 120.

Referring further to FIG. 1D, in the subsequent step, a planarized insulating layer 121 such as borophosphosilicate glass (BPSG) is formed over the wafer. Thereafter, a photolithographic and etching process is conducted on the wafer for removal of selected portions of the planarized insulating layer 121 so as to form contact holes 122 which penetrate through the planarized insulating layer 121 to expose the source/drain regions 120. Then the contact holes 122 are filled with a metal such as aluminum so as to form contact windows 123.

In the foregoing conventional MOS device, the forming of the $N^-$ lightly-doped regions 119 beneath the $N^+$ heavily-doped source/drain regions 120 is a mandatory step in order to form a diode junction between the source/drain regions 120 and the substrate 110 so as to increase the junction breakdown voltage between the same. However, when the applied voltage is increased, leakage current will occur in the diode junction and the magnitude thereof is proportional to the junction area between the source/drain regions 120 and the substrate 110. The occurrence of leakage current will cause an adverse effect to the electrical characteristics of the MOS device when a high voltage is applied thereto.

Moreover, since the contact windows 123 are formed directly above and in contact with the source/drain regions 120, any misalignment of critical dimensions of the circuit layout could lead to the forming of a leakage path therein.

SUMMARY OF THE INVENTION

It is therefore a primary objective of the present invention to provide a high-voltage MOS device which can prevent the breakdown at the junction between the source/drain regions and the substrate and also prevent the occurrence of leakage current therein.

It is another objective of the present invention to provide a method for fabricating the foregoing high-voltage MOS device.

In accordance with the foregoing and other objectives of the present invention, a new semiconductor structure and a method for fabricating a high-voltage MOS device is provided.

The method includes a first step of preparing a substrate and forming a pad oxide layer and a silicon nitride layer over the substrate; a second step of removing selected portions of the silicon nitride layer and using the remaining portions of the silicon nitride layer as a mask to implant a first-type dopant into the substrate; a third step of forming an isolation layer on exposed regions of the substrate and a plurality of drift regions beneath the isolation layers; a fourth step of removing selected portions of the silicon nitride layer and the pad oxide layer allowing the remaining portions of the silicon nitride layer and the pad oxide layer to cover a selected region where a gate is to be formed; a fifth step of forming a plurality of trenches in exposed regions of the substrate; a sixth step of removing the silicon nitride layer and the pad oxide layer; a seventh step of forming a first insulating layer over the trenches and the substrate; an eighth step of forming a first conductive layer over the first insulating layer; a ninth step of selectively removing portions of the first conductive layer allowing the remaining portions of the first conductive layer to cover a selected region on the substrate where a gate is to be formed, the remaining portions of the first conductive layer in the trenches having a top surface lower than the top surface of the substrate; a tenth step of removing the exposed first insulating layer until the remaining portions of the first insulating layer in the trenches have a top surface lower than the top surface of the first conductive layer; an eleventh step of forming a second conductive layer which fills up the trenches and covers the isolation layer and the first conductive layer; and a final twelfth step of selectively removing portions of the second conductive layer, the remaining portions of the second conductive layer serving as gate and source/drain regions.

The high-voltage MOS device fabricated by the foregoing method is based on a substrate having active regions defined thereon, the substrate being formed with isolation layers surrounding the active regions and a plurality of drift regions beneath the isolation regions. In structure, the high-voltage MOS device includes at least a gate layer formed over the active regions, at least a pair of source/drain regions formed to both sides of the gate layer, and an insulating layer formed between the source/drain regions and the substrate.

The invention has the following advantages. First, the source/drain regions occupy only a smaller area on the wafer. Second, the occurrence of leakage current can be prevented by the forming of an insulating layer between the source/drain regions and the substrate. Third, the use of polysilicon to form the conductive layers can prevent breakdown at the junction between the source/drain regions and the substrate. Fourth, since the contact window holes are formed above the isolation layers and the conductive layers, a misalignment of critical dimensions will not incur a leakage path in the source/drain regions.

BRIEF DESCRIPTION OF DRAWINGS

The invention can be more fully understood from the following detailed description of the preferred embodiments, with reference made to the accompanying drawings, wherein.

DETAILED DESCRIPTION OF PREFERRED EMBODIMENT

A preferred embodiment of the high-voltage MOS device according to the present invention is fabricated by a process described in the following with reference to FIGS. 2A through 2F.

Figure 1A:
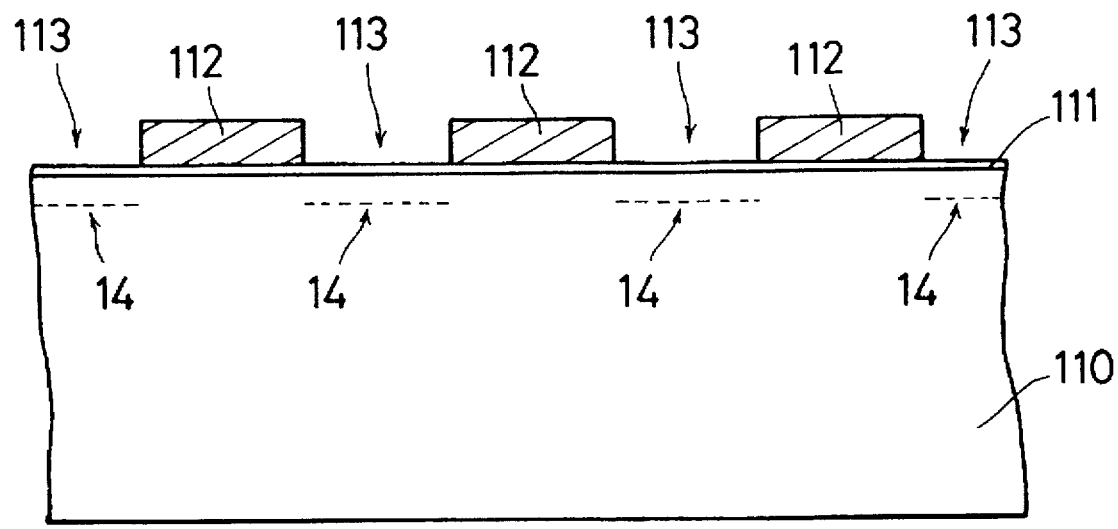
FIGS. 1A through 1D are sectional diagrams used to depict a conventional method for fabricating a conventional high-voltage MOS device.
Figure 1B:
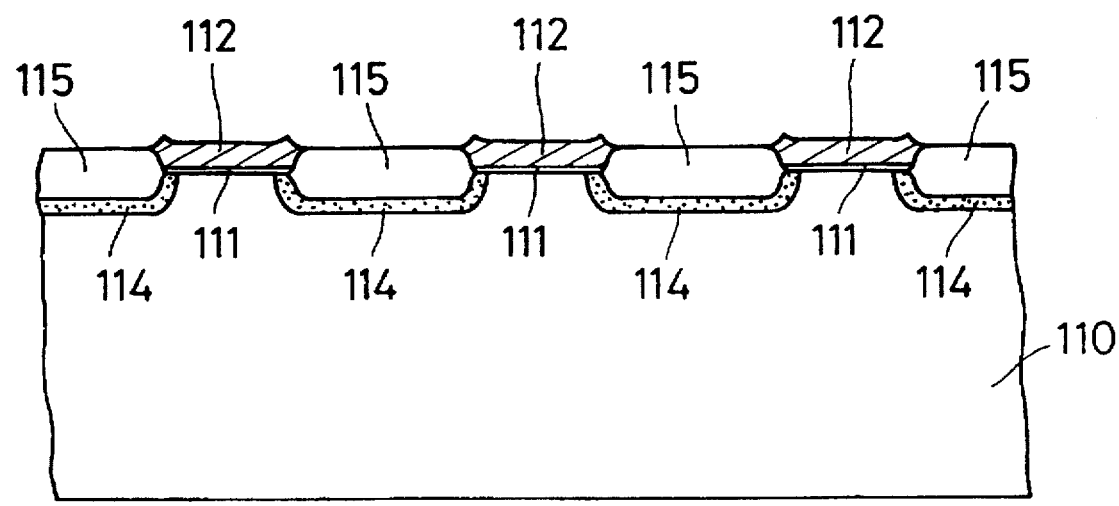
Figure 1C:
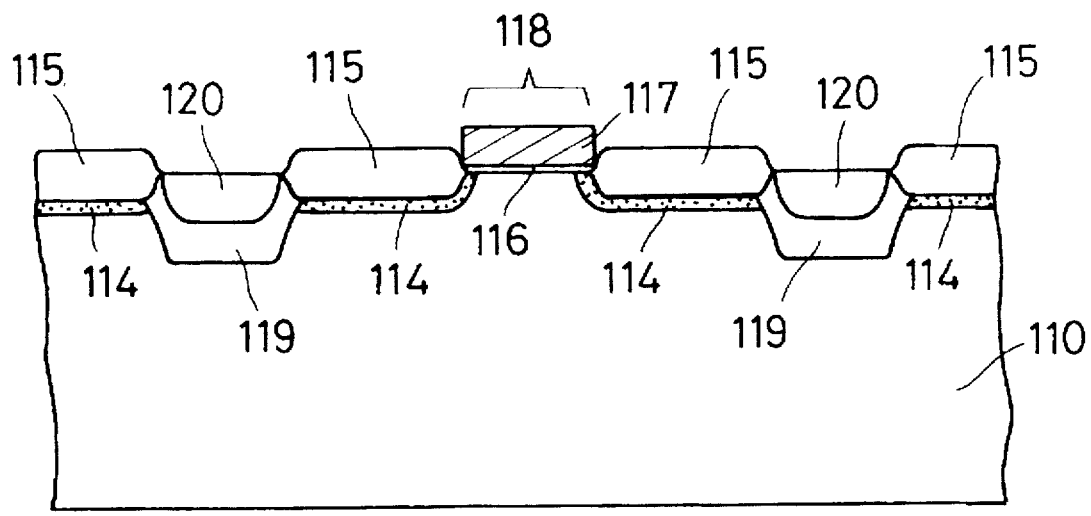
Figure 1D:
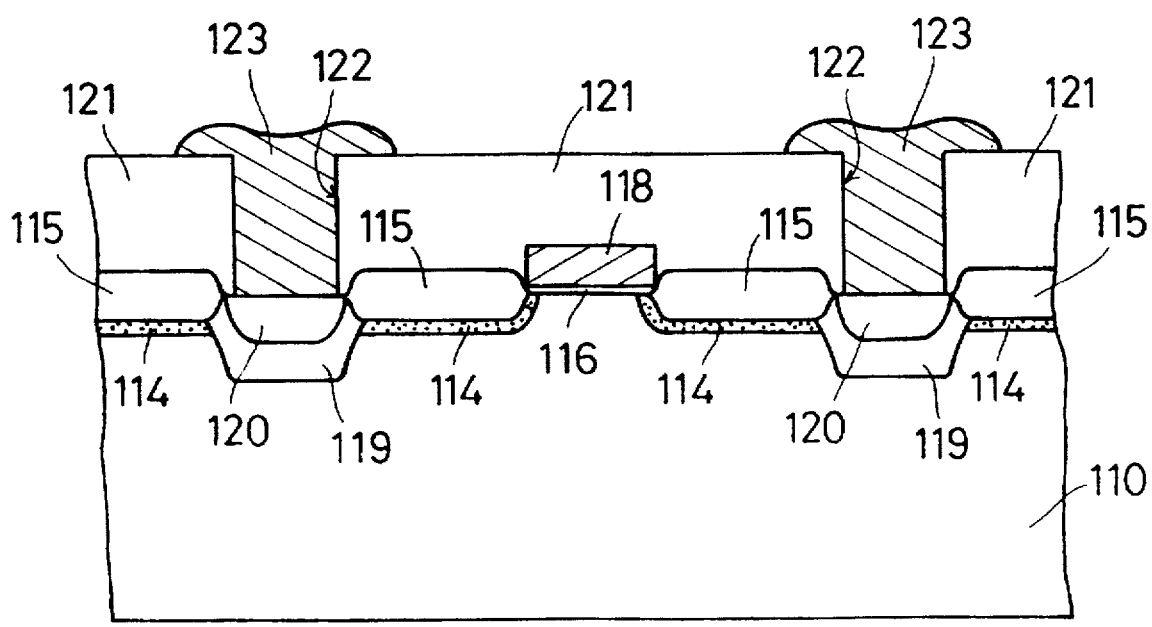
Figure 2A:
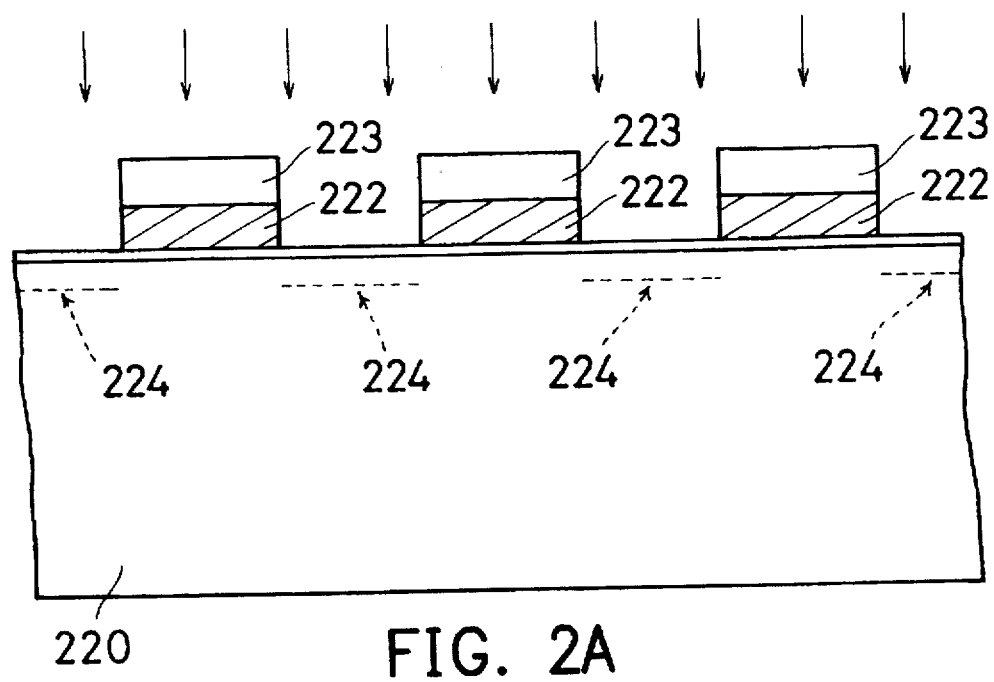
FIGS. 2A through 2F are sectional diagrams used to depict a method for fabricating a high-voltage MOS device according to the present invention.

Referring first to FIG. 2A, a substrate 220 such as a P-type substrate is prepared, and a pad oxide layer 221 is formed thereon. After that, a layer of silicon nitride 222 is formed over the pad oxide layer 221. Subsequently, a photoresist layer 223 is coated over the pad oxide layer 221 and a photolithographic and etching process is then conducted on the photoresist layer 223 for pattern definition and selective removal of the photoresist layer 223 to define the active regions on the wafer. The remaining portions of the silicon nitride layer 222 and the photoresist layer 223 are then used together as a mask to conduct an ion implantation process on the wafer so as to implant an N-type dopant such as phosphor ions into those regions designated by the reference numeral 224 in the substrate 220 so as to form lightly-doped regions at these regions 224.

Figure 2B:
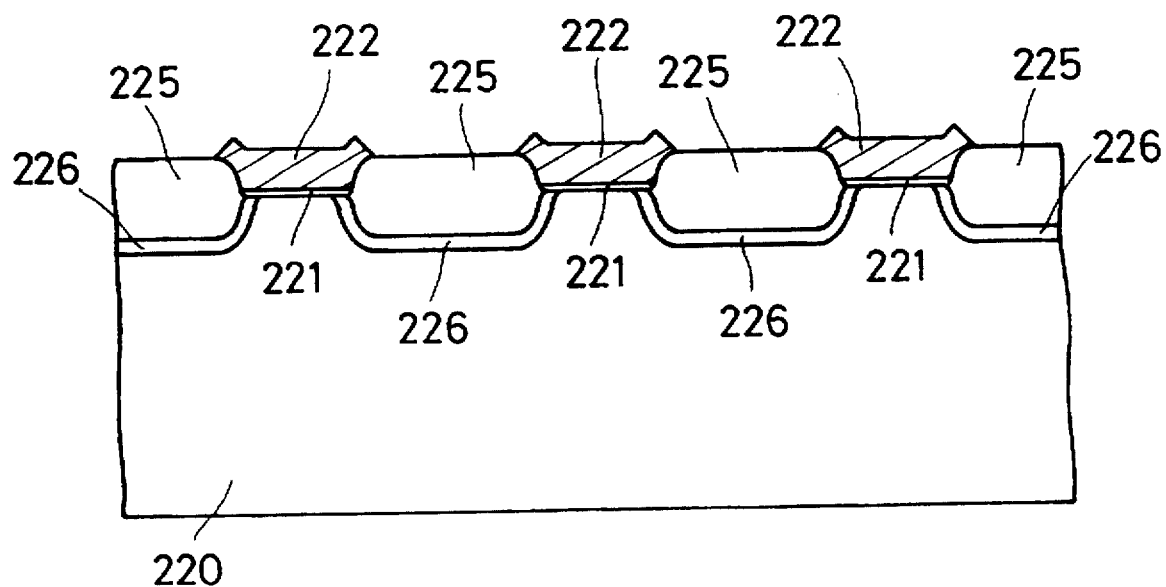

Referring next to FIG. 2B, in the subsequent step, the photoresist layer 223 is removed. After that, a plurality of isolation layers 225 such as field oxide layers are formed by local oxidation of silicon (LOCOS). Through this process, the doped N-type impurities around the regions 224 are also driven in to form a plurality of drift regions 226 beneath the isolation layers 225.

Figure 2C:
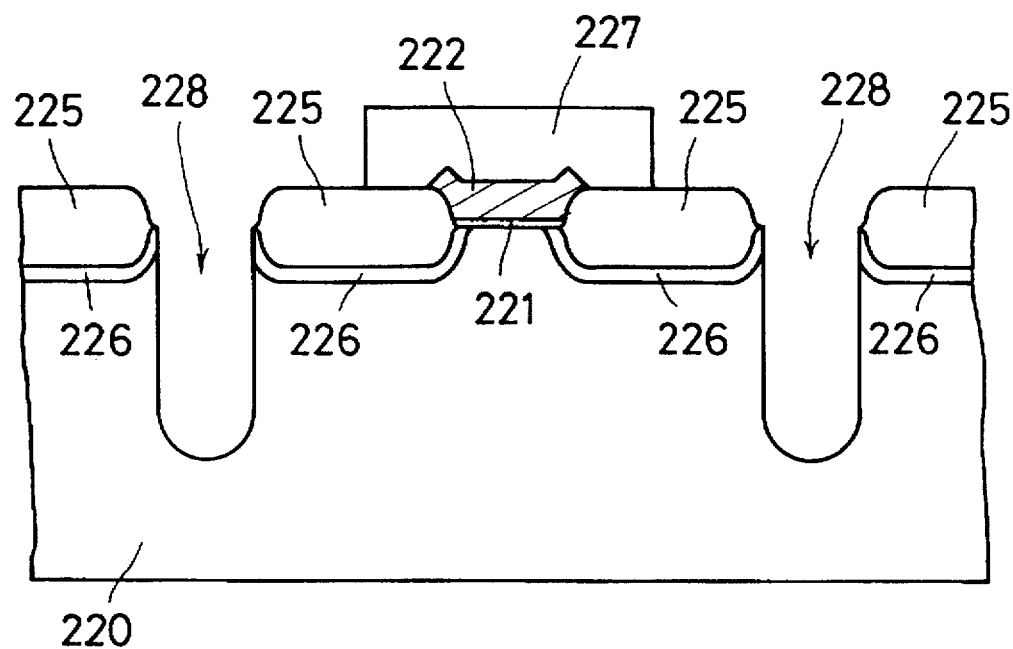

Referring next to FIG. 2C, in the subsequent step, a photoresist layer 227 is coated over the wafer and then selectively removed by a photolithographic and etching process to define the locations where the gates are to be formed. Thereafter, an etchihg process such as wet etching is conducted on the wafer so as to remove those portions of the silicon nitride layer 222 and pad oxide layer 221 that are uncovered by the photoresist layer 227. Following this, the photoresist layer 227 and the isolation layers 225 are used together as a mask to conduct a dry etching process on the wafer so as to etch away the exposed portions of the substrate 220. Through this process, two self-aligned trenches 228 are formed.

Figure 2D:
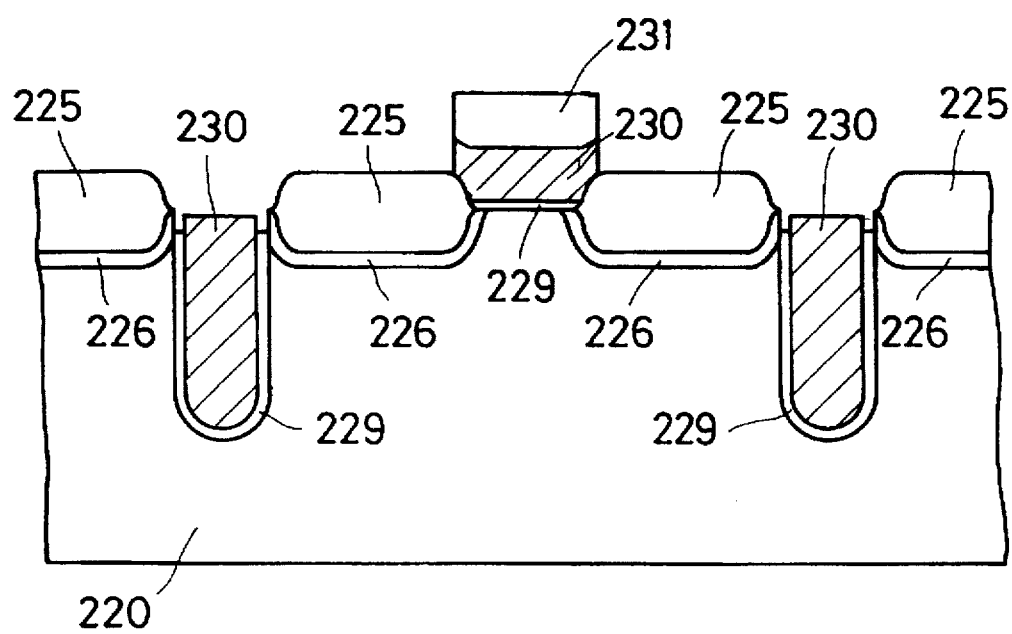

Referring next to FIG. 2D, in the subsequent step, the photoresist layer 227 along with the underlying silicon nitride layer 222 and pad oxide layer 221 are removed. After that, a first insulating layer 229 such as an oxide layer is formed by thermal oxidation over the exposed surfaces of the substrate 220 and the trenches 228. The first insulating layer 229 will be used as insulation between subsequently formed source/drain regions and the substrate 220 and also serve as a gate oxide layer between a subsequently formed gate and the substrate 220. Subsequently, a first conductive layer 230 such as a highly-doped polysilicon layer is formed by the CVD method over the first insulating layer 229 and fills up the trenches 228. Afterwards, a photoresist layer 231 is coated over the wafer and then selectively removed by a photolithographic and etching process to expose selected portions of the first conductive layer 230. Those portions of the first conductive layer 230 that are covered by the remaining portions of the photoresist layer 231 define the locations where the gates are to be formed. The exposed portions of the first conductive layer 230 are then etched away. The remaining portions of the first conductive layer 230 that are left in the trenches 228 have a top surface lower than the top surface of the substrate 220. Subsequently, the exposed first insulating layer 229 is removed by using hydrofluoric acid to conduct a wet etching process thereon until the top surface of the first insulating layer 229 is lower than the top surface of the first conductive layer 230. This remaining portion of the first insulating layer 229 will serve as insulation between the first conductive layer 230 and the substrate 220 so as to prevent the occurrence of leakage current.

Figure 2E:
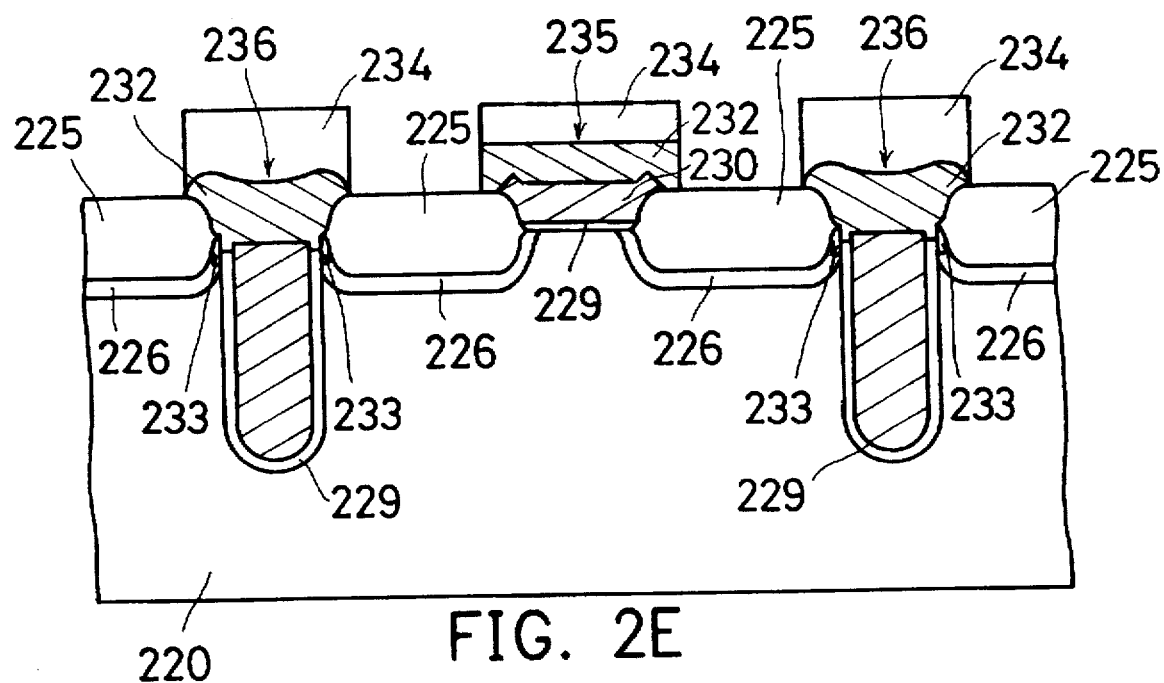

Referring next to FIG. 2E, in the following step, the photoresist layer 231 is removed. Subsequently, a second conductive layer 232 such as a highly-doped polysilicon layer is formed by the CVD method over the wafer. Since the second conductive layer 232 has bottom portions which come into contact with the top surface of the substrate 220, the highly-doped impurities can diffuse via these contact portions into the substrate 220, thus forming $N^+$ highly-doped diffusion regions 233 in the substrate 220, as illustrated in FIG. 2E. Afterwards, a photoresist layer 234 is coated over the wafer and then selectively removed by a photolithographic and etching process so as to use it as a mask to subsequently remove selected portions of the second conductive layer 232 and the first conductive layer 230, whereby a gate 235 and a pair of source/drain regions 236 are formed. As shown in the diagram, the gate 235 consists of a remaining part of the second conductive layer 232 and the first conductive layer 230, and the source/drain regions 236 consist of another remaining part of the same. Further, the source/drain regions 236 have portions which cover part of the surface of the isolation layers 225. Subsequently, the photoresist layer 234 is removed, and this completes the fabrication for the MOS device.

After the steps of FIG. 2D, the following process involves the fabrication of a plurality of metal contact windows in the MOS device. This process will be described in the following.

Figure 2F:
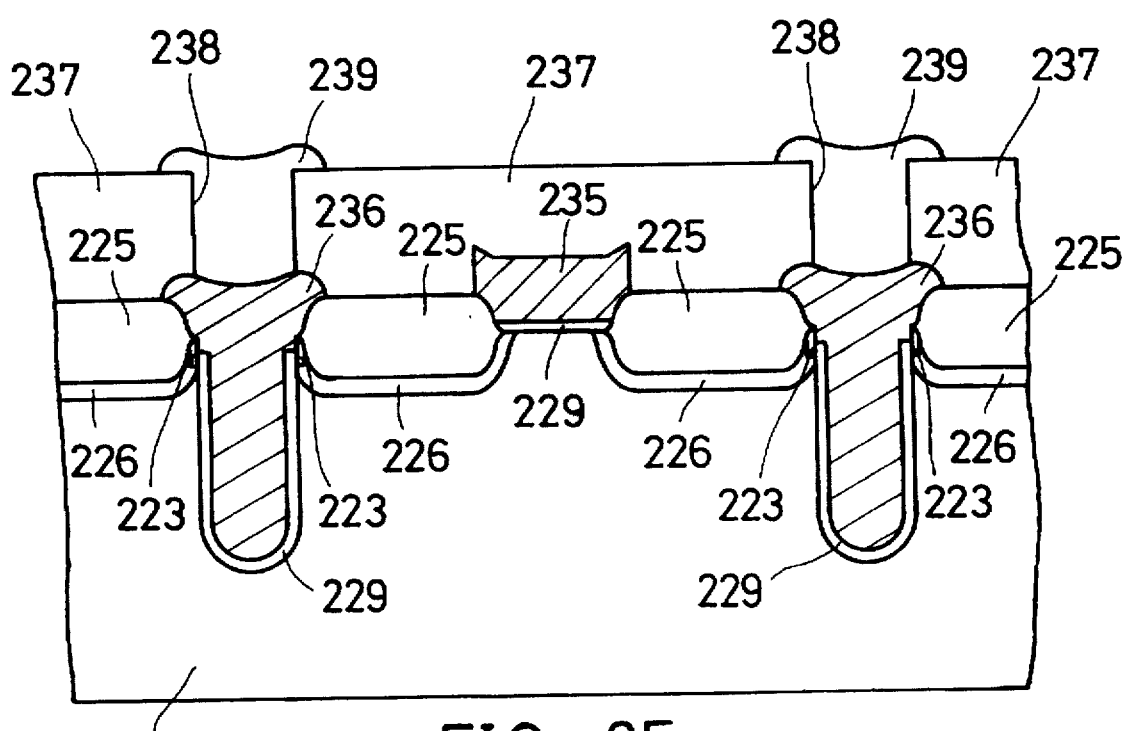

Referring further to FIG. 2F, a second insulating layer 237 such as a planarized layer of borophosphosilicate glass (BPSG) is formed over the wafer. Following this, the second insulating layer 237 is selectively removed so as to form a plurality of contact window holes 238 therein. These contact window holes 238 expose the top surface of the source/drain regions 236. Subsequently, a metal, such as aluminum, is filled into the contact window holes 238, thus forming contact windows 239 which will be used to electrically connect the source/drain regions 236 to other external circuits. All the subsequent processes to complete the fabrication of the chip are conventional processes and not related to the scope of the invention, so that description thereof will not be given.

From the foregoing disclosure, it is apparent to those skilled in the art of semiconductor technology that the invention has the following advantages. First, the use of trenches to form the source/drain regions allows the source/drain regions to occupy only a smaller area on the wafer so that high integration can be better achieved. Second, the provision of an insulating layer beneath the source/drain regions allows the isolation of the source/drain regions from the substrate, thus preventing the occurrence of leakage current therein. Third, the use of polysilicon to form the conductive layers can prevent breakdown at the junction between the source/drain regions and the substrate. Fourth, since the contact window holes are formed above the isolation layers and the conductive layers, a misalignment of critical dimensions will not cause the forming of a leakage path in the source/drain regions.

The invention has been described using exemplary preferred embodiments. However, it is to be understood that the scope of the invention is not limited to the disclosed embodiments. To the contrary, it is intended to cover various modifications and similar arrangements. The scope of the claims, therefore, should be accorded the broadest interpretation so as to encompass all such modifications and similar arrangements.

What is claimed is:

1. A method for fabricating a high-voltage MOS device, comprising the steps of:
    (1) preparing a substrate, and then forming a pad oxide layer and a silicon nitride layer over the substrate;
    (2) removing selected portions of the silicon nitride layer and using the remaining portions of the silicon nitride layer as a mask to implant a first-type dopant into the substrate;
    (3) forming an isolation layer on exposed regions of the substrate and a plurality of drift regions beneath the isolation layers;
    (4) removing selected portions of the silicon nitride layer and the pad oxide layer, the remaining portions of the silicon nitride layer and the pad oxide layer covering a selected region where a gate is to be formed;
    (5) forming a plurality of trenches in exposed regions of the substrate;
    (6) removing the silicon nitride layer and the pad oxide layer;
    (7) forming a first insulating layer over the trenches and the substrate;
    (8) forming a first conductive layer over the first insulating layer;
    (9) selectively removing portions of the first conductive layer allowing the remaining portions of the first conductive layer to cover a selected region on the substrate where a gate is to be formed, the remaining portions of the first conductive layer in the trenches having a top surface lower than the top surface of the substrate;
    (10) removing the exposed first insulating layer until the remaining portions of the first insulating layer in the trenches have a top surface lower than the top surface of the first conductive layer;
    (11) forming a second conductive layer which fills up the trenches and covers the isolation layer and the first conductive layer; and
    (12) selectively removing portions of the second conductive layer, the remaining portions of the second conductive layer serving as gate and source/drain regions.

2. The method of claim 1, wherein in said step (2) the first-type dopant is an N-type dopant.

3. The method of claim 1, wherein in said step (3) the isolation layer is a field oxide layer.

4. The method of claim 3, wherein said field oxide layer is formed by local oxidation of silicon (LOGOS).

5. The method of claim 1, wherein in said step (7) the first insulating layer is an oxide layer.

6. The method of claim 1, wherein in said step (5) the trenches are formed by a self-alignment dry etching process.

7. The method of claim 1, wherein in said step (8) the first conductive layer is a highly-doped polysilicon layer.

8. The method of claim 1, wherein in said step (11) the second conductive layer is a highly-doped polysilicon layer.

9. The method of claim 1, wherein said step (1) further includes a substep of selectively removing portions of the first conductive layer so as to form the gate.

10. The method of claim 1, wherein said step (1) further includes the substeps of:
    forming a second insulation layer; and
    forming a plurality of contact windows which penetrate the second insulation layer to expose one of the source/drain regions.

11. The method of claim 10, wherein the second insulation layer is a layer of borophosphosilicate glass (BPSG).

* * * * *